(12) United States Patent
Sagawa

(10) Patent No.: US 11,871,634 B2
(45) Date of Patent: Jan. 9, 2024

(54) DISPLAY DEVICE

(71) Applicant: Sony Group Corporation, Tokyo (JP)

(72) Inventor: Hiroshi Sagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 17/374,012

(22) Filed: Jul. 13, 2021

(65) Prior Publication Data

US 2021/0343798 A1    Nov. 4, 2021

Related U.S. Application Data

(63) Continuation of application No. 16/538,141, filed on Aug. 12, 2019, now Pat. No. 11,081,529, which is a (Continued)

(30) Foreign Application Priority Data

Jun. 16, 2010 (JP) .................................. 2010-137260

(51) Int. Cl.
   *G09G 3/30*       (2006.01)
   *H10K 59/35*     (2023.01)
   (Continued)

(52) U.S. Cl.
   CPC ........... *H10K 59/35* (2023.02); *G09G 3/3225* (2013.01); *H10K 50/80* (2023.02); *H10K 50/813* (2023.02);
   (Continued)

(58) Field of Classification Search
   CPC . H01L 27/3211; H01L 27/32; H01L 27/3206; H01L 27/3258; H01L 27/3262;
   (Continued)

(56) References Cited

U.S. PATENT DOCUMENTS 6,055,111 A    4/2000   Nomura et al.
6,645,656 B1  11/2003   Chen et al.
(Continued)

FOREIGN PATENT DOCUMENTS

CN    1622714 A    6/2005
CN    1665360      9/2005
(Continued)

OTHER PUBLICATIONS

Chinese Office Action dated Dec. 17, 2014, for corresponding Chinese Appln. No. 201110154464.4.
(Continued)

*Primary Examiner* — Abdul-Samad A Adediran
(74) *Attorney, Agent, or Firm* — K&L Gates LLP

(57) ABSTRACT

In one example embodiment, a display device for suppressing reflected light includes a driving circuit and a display region which includes a plurality of pixels. In one example embodiment, the plurality of pixels includes a first pixel having a first light emitting element which includes a first light emitting portion having a first layer surface. In one example embodiment, first pixel includes a second light emitting element which includes a second light emitting portion having a second, different layer surface. In one example embodiment, the first pixel includes a third light emitting element which includes a third light emitting portion having a third, different layer surface.

16 Claims, 12 Drawing Sheets

Related U.S. Application Data continuation of application No. 15/837,867, filed on Dec. 11, 2017, now Pat. No. 10,381,415, which is a continuation of application No. 15/363,694, filed on Nov. 29, 2016, now abandoned, which is a continuation of application No. 14/824,840, filed on Aug. 12, 2015, now abandoned, which is a continuation of application No. 13/155,027, filed on Jun. 7, 2011, now Pat. No. 9,761,637.

(51) Int. Cl.
| | | |
|---|---|---|
| *H10K 50/80* | (2023.01) | |
| *H10K 50/813* | (2023.01) | |
| *H10K 59/00* | (2023.01) | |
| *H10K 59/17* | (2023.01) | |
| *H10K 59/30* | (2023.01) | |
| *H10K 59/124* | (2023.01) | |
| *H10K 59/131* | (2023.01) | |
| *H10K 59/179* | (2023.01) | |
| *H10K 59/121* | (2023.01) | |
| *G09G 3/3225* | (2016.01) | |
| *G09G 3/3233* | (2016.01) | |
| *G09G 3/3266* | (2016.01) | |

(52) U.S. Cl.
CPC .......... *H10K 59/00* (2023.02); *H10K 59/124* (2023.02); *H10K 59/1213* (2023.02); *H10K 59/1216* (2023.02); *H10K 59/131* (2023.02); *H10K 59/17* (2023.02); *H10K 59/179* (2023.02); *H10K 59/30* (2023.02); *G09G 3/3233* (2013.01); *G09G 3/3266* (2013.01); *G09G 2300/0842* (2013.01); *G09G 2310/0286* (2013.01); *G09G 2310/08* (2013.01); *G09G 2330/028* (2013.01)

(58) Field of Classification Search
CPC .......... H01L 27/3265; H01L 27/3276; H01L 27/3281; H01L 27/3288; H01L 51/52; H01L 51/5209; H01L 27/3244; G09G 3/3225; G09G 3/3233; G09G 3/3266; G09G 2300/0842; G09G 2310/0286; G09G 2310/08; G09G 2330/028; G02F 1/133707; H05B 33/22
USPC .................. 313/506; 345/76, 82; 349/113
See application file for complete search history.

(56) References Cited

U.S. PATENT DOCUMENTS

| | | | |
|---|---|---|---|
| 6,645,657 B2 | 11/2003 | Huang et al. | |
| 7,466,294 B2 | 12/2008 | Yamazaki et al. | |
| 2003/0197819 A1* | 10/2003 | Sunohara | G02F 1/133707 349/113 |
| 2004/0178410 A1 | 9/2004 | Koo | |
| 2005/0189875 A1 | 9/2005 | Nakada | |
| 2005/0280364 A1 | 12/2005 | Omura et al. | |
| 2006/0175966 A1 | 8/2006 | Yamada et al. | |
| 2007/0075627 A1* | 4/2007 | Kimura | H01L 27/3244 313/506 |
| 2007/0176216 A1 | 8/2007 | Watanabe | |
| 2008/0024402 A1* | 1/2008 | Nishikawa | H05B 33/22 345/82 |
| 2008/0143649 A1 | 6/2008 | Asaki et al. | |
| 2008/0224963 A1 | 9/2008 | Takagi et al. | |
| 2008/0246027 A1 | 10/2008 | Kim | |
| 2008/0309232 A1 | 12/2008 | Yamamoto | |
| 2009/0039773 A1 | 2/2009 | Jun et al. | |
| 2009/0058273 A1 | 3/2009 | Shimizu | |
| 2009/0201232 A1 | 8/2009 | Kim | |
| 2009/0273548 A1* | 11/2009 | Sagawa | H01L 27/3262 345/76 |
| 2010/0084968 A1 | 4/2010 | Watanabe et al. | |
| 2010/0090593 A1 | 4/2010 | Mori et al. | |
| 2010/0096988 A1 | 4/2010 | Kitabayashi et al. | |
| 2010/0188376 A1 | 7/2010 | Sagawa et al. | |

FOREIGN PATENT DOCUMENTS

| | | |
|---|---|---|
| CN | 1947464 | 4/2007 |
| CN | 101013745 | 8/2007 |
| CN | 101017872 A | 8/2007 |
| CN | 101267700 | 9/2008 |
| CN | 101384110 A | 3/2009 |
| CN | 101609646 | 6/2009 |
| CN | 101728417 | 6/2010 |
| JP | 2006-269251 | 10/2006 |
| TW | 594621 B | 6/2004 |
| WO | 01/39554 | 5/2001 |
| WO | 2006/137932 | 12/2006 |

OTHER PUBLICATIONS

Chinese Office Action dated Jan. 2, 2018, in corresponding Chinese Application No. 201510685076.7.
Chinese Office Action dated Dec. 4, 2018, in corresponding Chinese Application No. 201510685076.7.

* cited by examiner

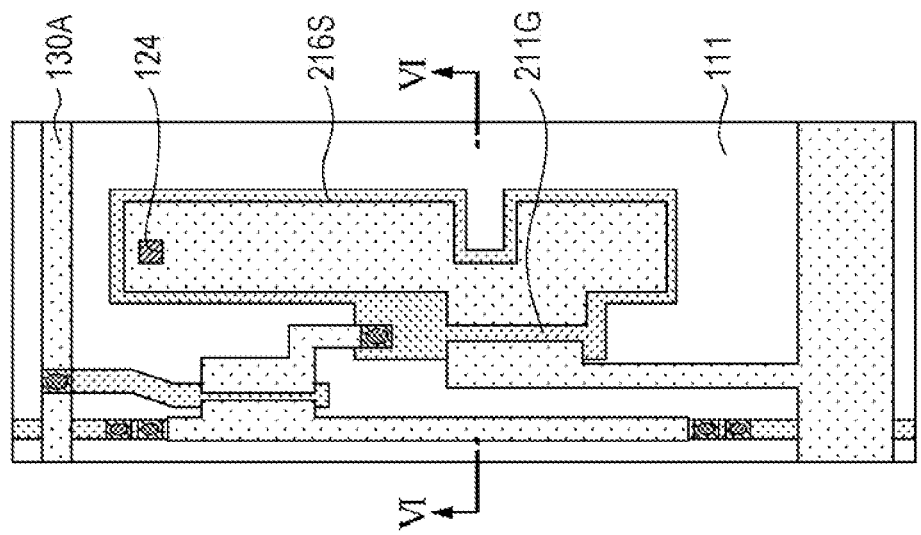
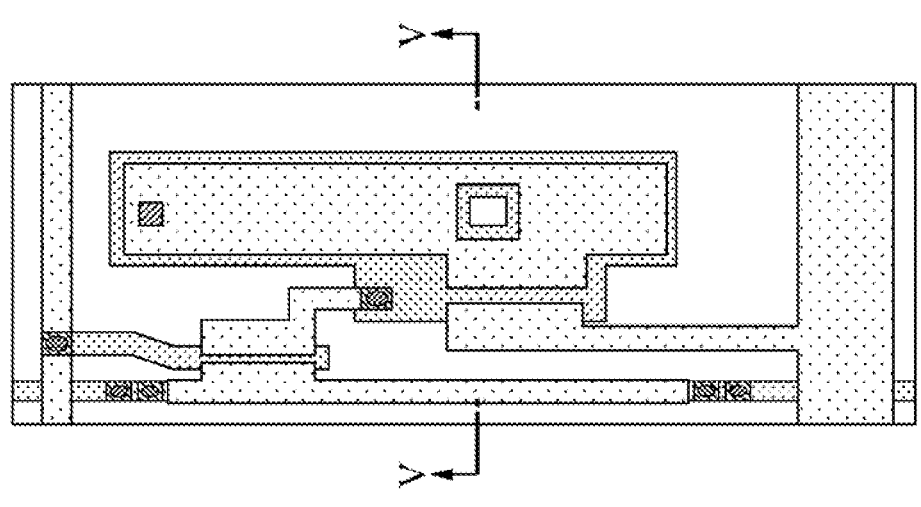
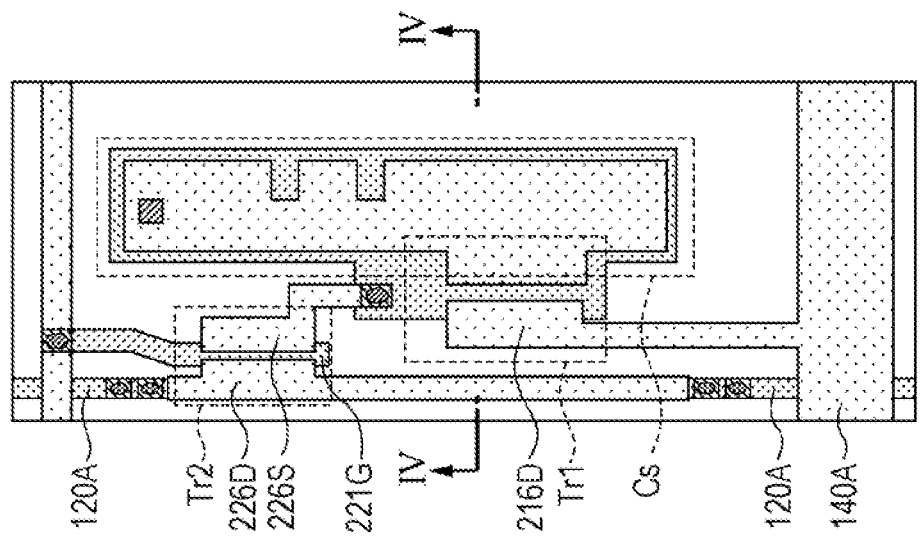

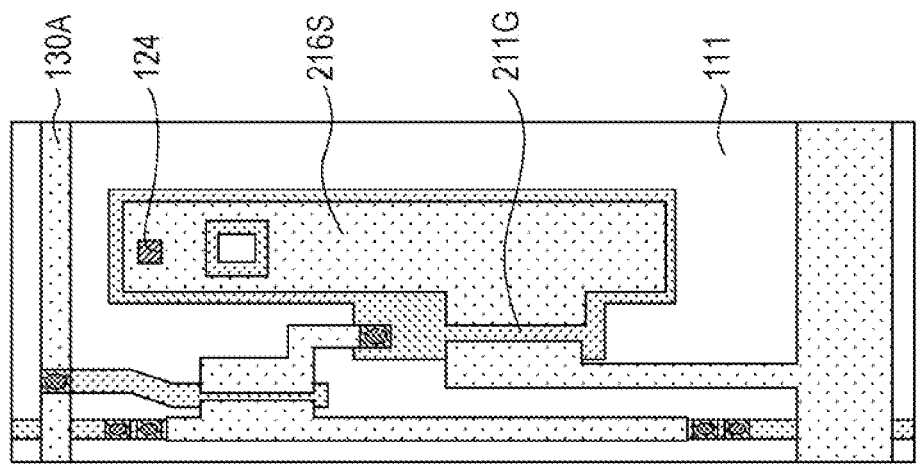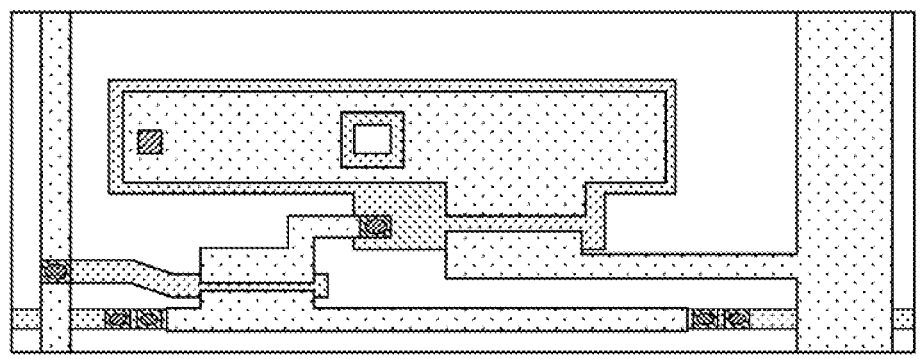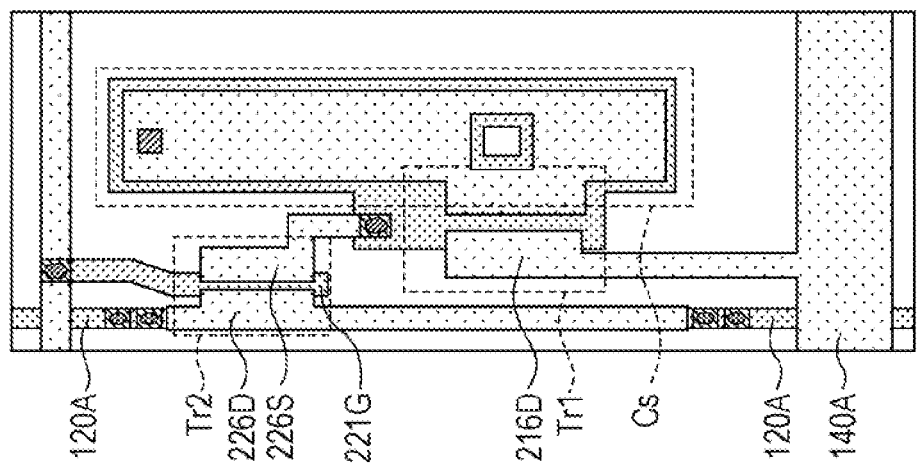

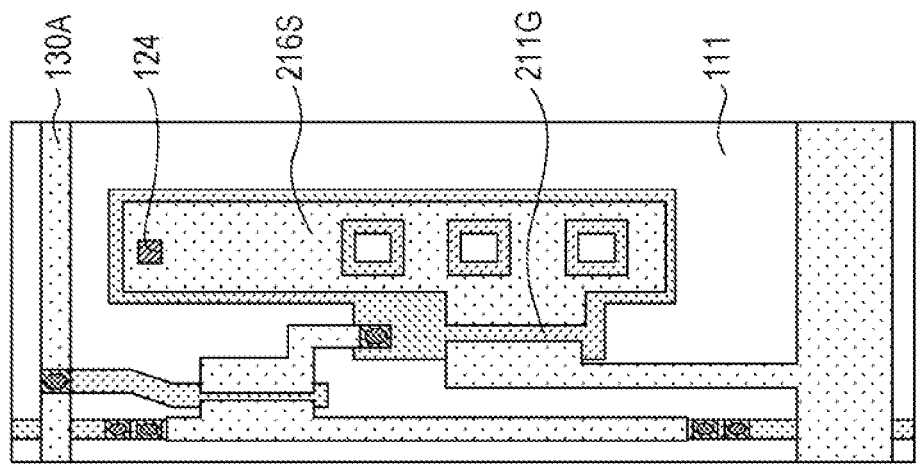
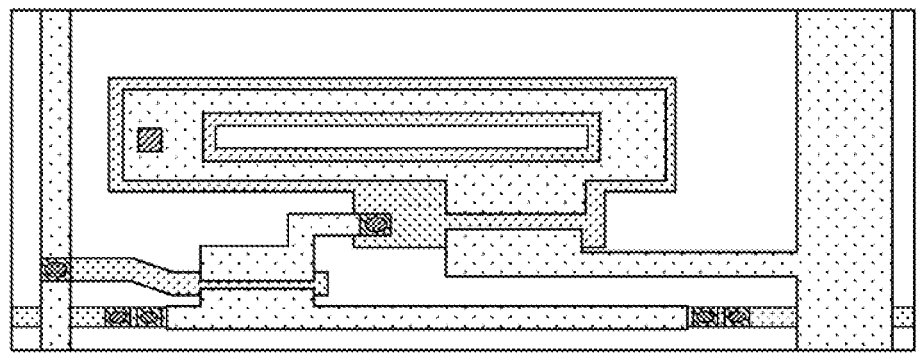
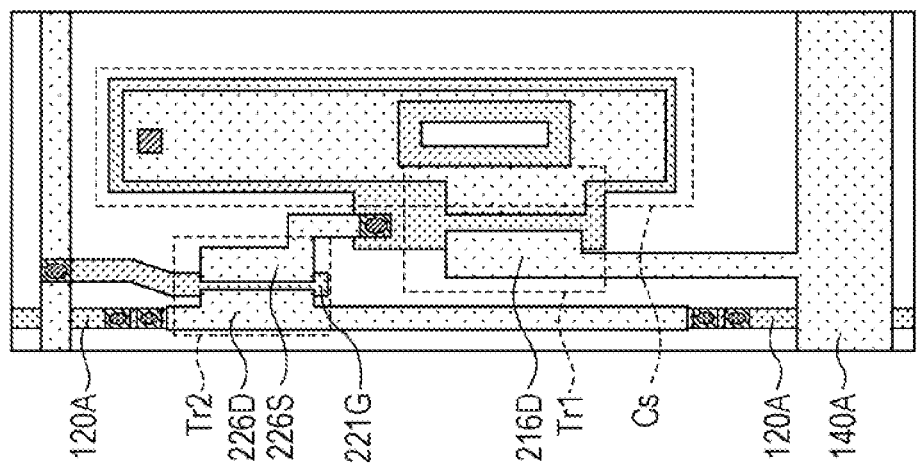

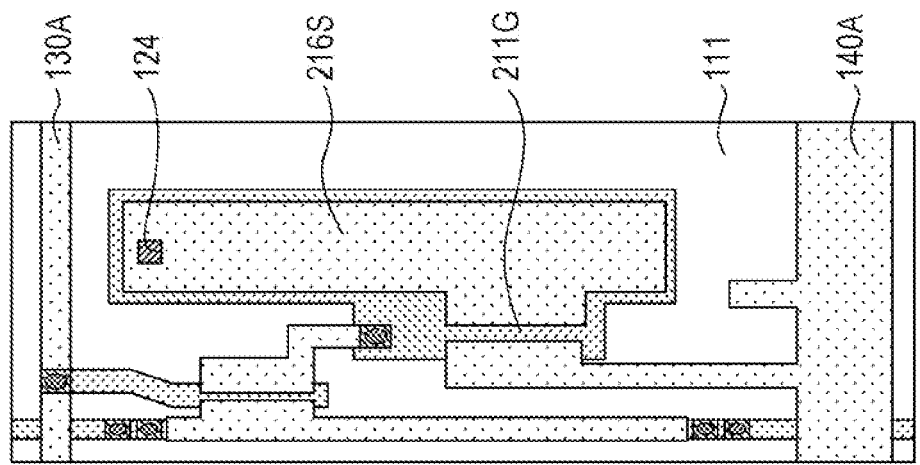
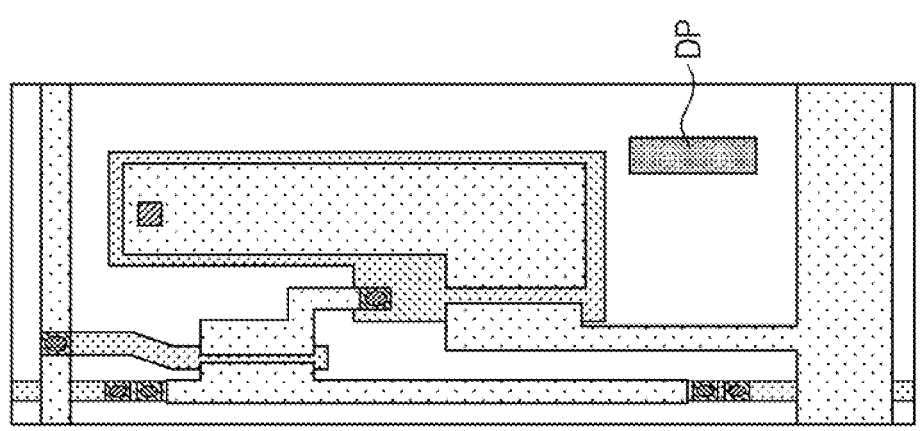
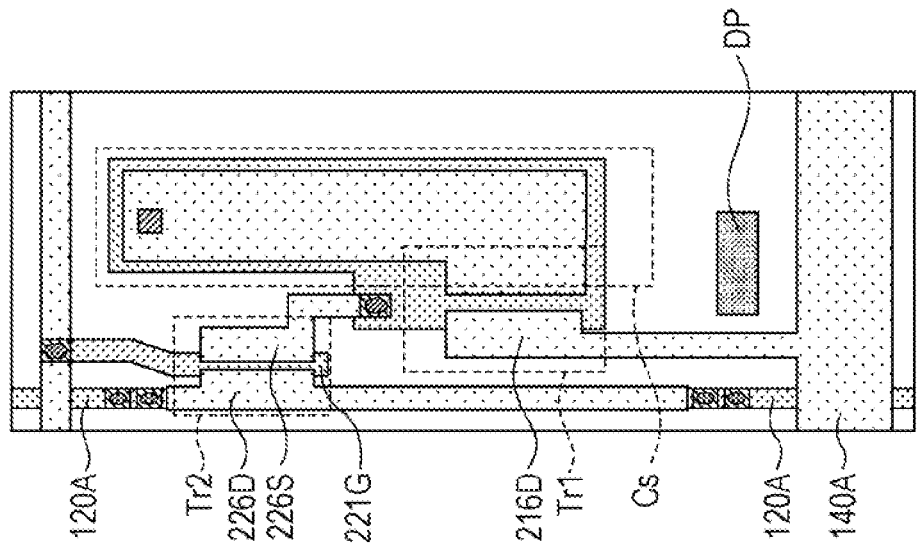

DISPLAY DEVICE

CROSS REFERENCES TO RELATED APPLICATIONS

The present application is a continuation of U.S. patent application Ser. No. 16/538,141, filed Aug. 12, 2019, which is a continuation of U.S. patent application Ser. No. 15/837,867, filed Dec. 11, 2017, now issued U.S. Pat. No. 10,381,415, issued on Aug. 13, 2019, which application is a continuation of U.S. patent application Ser. No. 15/363,694, filed Nov. 29, 2016, which application is a continuation of U.S. patent application Ser. No. 14/824,840, filed Aug. 12, 2015, which is a continuation application of U.S. patent application Ser. No. 13/155,027, filed Jun. 7, 2011, issued as U.S. Pat. No. 9,761,637 on Sep. 12, 2017, which application claims priority to Japanese Patent Application No. JP 2010-137260, filed in the Japanese Patent Office on Jun. 16, 2010, the entire contents of which is being incorporated herein by reference.

BACKGROUND

In recent years, as display devices replacing liquid crystal displays, organic EL displays using self-luminous organic light emitting elements have been put into practical use. The organic EL displays are of self-luminous type, and thus have a wide viewing angle as compared with liquid crystal displays or the like and sufficient responsiveness to high definition and high speed video signals.

Regarding the light emitting elements hitherto, a trial has been carried out to improve display performance by controlling light emitted from emission layers, for example, by improving chromatic purity of emission colors or luminous efficiency through introducing a resonator structure (for example, see International Publication No. 01/39554). For example, as shown in FIG. 13, in an organic light emitting element of a top emission type where light is emitted from a surface (upper surface) opposite to a substrate, a light emitting portion Z10 has a structure where an anode electrode Z13, a organic layer Z14, and a cathode electrode Z16 are sequentially laminated via a driving transistor ZTr1, and light is multiply reflected from the organic layer Z14 between the anode electrode Z13 and the cathode electrode Z16. Here, the driving transistor ZTr1 drives the light emitting portion Z10 and constitutes a pixel driving circuit along with a signal line Z120A or the like. In addition, in FIG. 13, the reference numeral Z111 denotes a substrate, the reference numeral Z212 denotes a gate insulation layer of the driving transistor ZTr1, the reference numeral Z217 denotes a protective layer made of silicon nitride or the like, and the reference numeral Z218 denotes a planarization layer made of polyimide or the like. Also, the reference numeral Z17 denotes a metal layer which is an auxiliary line, the reference numeral Z24 denotes an aperture defining insulation layer, the reference numeral Z18 is a protective layer made of silicon nitride or the like, and the reference numeral Z19 denotes a sealing substrate made of a transparent material.

In addition, in a typical organic EL display, as shown in FIG. 13, the organic light emitting element Z10 has a sterical shape with concave and convex in the laminated direction in the emission region, not a planarized shape. For this reason, if the external light $L_{IN}$ is incident on the light emitting portion Z10, the reflected light $L_R$ other than specular light causes diffraction phenomenon, and thus a viewer may see unwanted rainbow colored light according to positions of the viewer. There is a problem in that this unnecessary rainbow colored light interferes within the organic light emitting elements in a pixel or within adjacent pixels and may be strengthened at a specific angle.

Specifically, the intensity of the reflected light $L_R$ may increase if satisfying the following conditional equation (1), and the intensity of the reflected light $L_R$ may decrease if satisfying the following conditional equation (2). Here, m is an integer value, X is a wavelength, P is a pitch of arranged pixels, and θ is an angle of the reflected light $L_R$ with respect to the specular light.

$$m \cdot \lambda = P \cdot \sin \theta \quad (1)$$

$$(m+\tfrac{1}{2}) \cdot \lambda = P \cdot \sin \theta \quad (2)$$

The occurrence of the interference greatly hinders the viewer from recognizing the originally displayed image.

This sterical shape is caused by the existence of lines such as the signal line Z120A in addition to the driving transistor ZTr1, which are positioned in the lower layer of the light emitting portion Z10. Therefore, if the protective layer Z217 or the planarization layer Z218 covering the pixel driving circuit is made sufficiently thick, the upper surface of the planarization layer Z218 on which the light emitting portion Z10 is formed and thus a planarized surface with high accuracy can be obtained. Therefore, the planarity of the light emitting portion Z10 is naturally improved. However, in that case, the thickness of the entire device increases, and thus there is a problem in that the intrinsic advantage of the organic EL display which is thinner than the liquid crystal display and the like may not be utilized.

It is desirable to provide a display device which is thin and can achieve better image display performance.

SUMMARY

The present disclosure relates to a display device provided with self-luminous light emitting elements including organic layers.

In one example embodiment, a display device for suppressing reflected light includes a driving circuit and a display region. In one example embodiment, the display region includes a plurality of pixels which includes a first pixel. In one example embodiment, the first pixel has a first light emitting element which includes a first light emitting portion having a first layer surface. In one example embodiment, the first pixel has a second light emitting element which includes a second light emitting portion having a second, different layer surface. In one example embodiment, the first pixel has a third light emitting element which includes a third light emitting portion having a third, different layer surface.

In one example embodiment, the first light emitting element includes a first thin film transistor structure, the second light emitting element includes a second, different thin film transistor structure, and the third light emitting element includes a third, different thin film transistor structure. In one example embodiment, each of the layer surfaces of each of the light emitting elements is different from each other based on each of the different, thin file transistor structures.

In one example embodiment, the first light emitting element includes a first metal layer, the second light emitting element includes a second, different metal layer, and the third light emitting element includes a third, different metal layer. In one example embodiment, each of the layer surfaces of each of the light emitting elements is different from each other based on each of the different, metal layers.

In one example embodiment, the plurality of pixels includes a second pixel located horizontally adjacent to the first pixel. In one example embodiment, the second pixel has a fourth light emitting element which includes a fourth light emitting portion having a fourth, different layer surface. In one example embodiment, the second pixel has a fifth light emitting element which includes a fifth light emitting portion having a fifth, different layer surface. In one example embodiment, the second pixel has a sixth light emitting element which includes a sixth light emitting portion having a sixth, different layer surface. In one example embodiment, each of the layer surfaces is horizontally adjacent to each other.

In one example embodiment, the lighting elements of the first pixel and the lighting elements of the second pixel are arranged in a constant order in a first direction.

In one example embodiment, the display device includes: (a) a first driving circuit having a first driving element configured to drive the first light emitting element, wherein a first electrode having a first planar shape forms the first driving element; (b) a second driving circuit having a second driving element configured to drive the second light emitting element, wherein a second electrode having a second planar shape forms the second driving element; (c) a third driving circuit having a third driving element configured to drive the third light emitting element, wherein a third electrode having a third planar shape forms the third driving element; (d) a fourth driving circuit having a fourth driving element configured to drive the fourth light emitting element, wherein a fourth electrode having a fourth planar shape forms the fourth driving element, the fourth electrode having a different undulating layer surface from the first electrode; (e) a fifth driving circuit having a fifth driving element configured to drive the fifth light emitting element, wherein a fifth electrode having a fifth planar shape forms the fifth driving element, the fifth electrode having a different undulating layer surface from the second electrode; and (f) a sixth driving circuit having a sixth driving element configured to drive the sixth light emitting element, wherein a sixth electrode having a sixth planar shape forms the sixth driving element, the sixth electrode having a different undulating layer surface from the third electrode.

In one example embodiment, each of the lighting emitting elements are different from each other.

In one example embodiment, the first light emitting element includes: (i) a first electrode layer; (ii) a first organic layer which includes a first emission layer; and (iii) a second electrode layer. In one example embodiment, the second light emitting element includes: (i) a third electrode layer; (ii) a second organic layer which includes a second emission layer; and (iii) a fourth electrode layer. In one example embodiment, the third light emitting element includes: (i) a fifth electrode layer; (ii) a third organic layer which includes a third emission layer; and (iii) a sixth electrode layer.

In one example embodiment, the plurality of pixels are arranged in a first direction at a first period and arranged in a second direction at a second period, the first direction crossing the second direction, the second period being longer than the first period.

In one example embodiment, the display device includes: (a) a first driving circuit having a first driving element configured to drive the first light emitting element, wherein a first electrode having a first planar shape forms the first driving element; (b) a second driving circuit having a second driving element configured to drive the second light emitting element, wherein a second electrode having a second, different planar shape forms the second driving element; and (c) a third driving circuit having a third driving element configured to drive the third light emitting element, wherein a third electrode having a third, different planar shape forms the third driving element.

In one example embodiment, the plurality of pixels are arranged in a first direction and arranged in a second, different direction. In one example embodiment, the plurality of pixels include a plurality of light emitting elements having undulation of the same layer surface shape which are arranged at an irregular interval in at least one of the first direction and the second direction.

In one example embodiment, a method of manufacturing a display device includes, for a pixel, forming, on a substrate: (a) a first light emitting element which includes a first light emitting portion having a first layer surface; (b) a second light emitting element which includes a second light emitting portion having a second, different layer surface; and (c) a third light emitting element which includes a third light emitting portion having a third, different layer surface.

Additional features and advantages are described herein, and will be apparent from the following Detailed Description and the figures.

BRIEF DESCRIPTION OF THE FIGURES

FIGS. 7A to C are a plan view illustrating a configuration of the pixel driving circuit forming layer shown in FIGS. 4 to 6.

FIGS. 10A to C are a plan view illustrating a configuration of a pixel driving circuit forming layer according to a first modified example.

FIGS. 11A to C are a plan view illustrating a configuration of a pixel driving circuit forming layer according to a second modified example.

FIGS. 12A to C are a plan view illustrating a configuration of a pixel driving circuit forming layer according to a third modified example.

DETAILED DESCRIPTION

Embodiments of the present application will be described below in detail with reference to the drawings.

Figure 1:
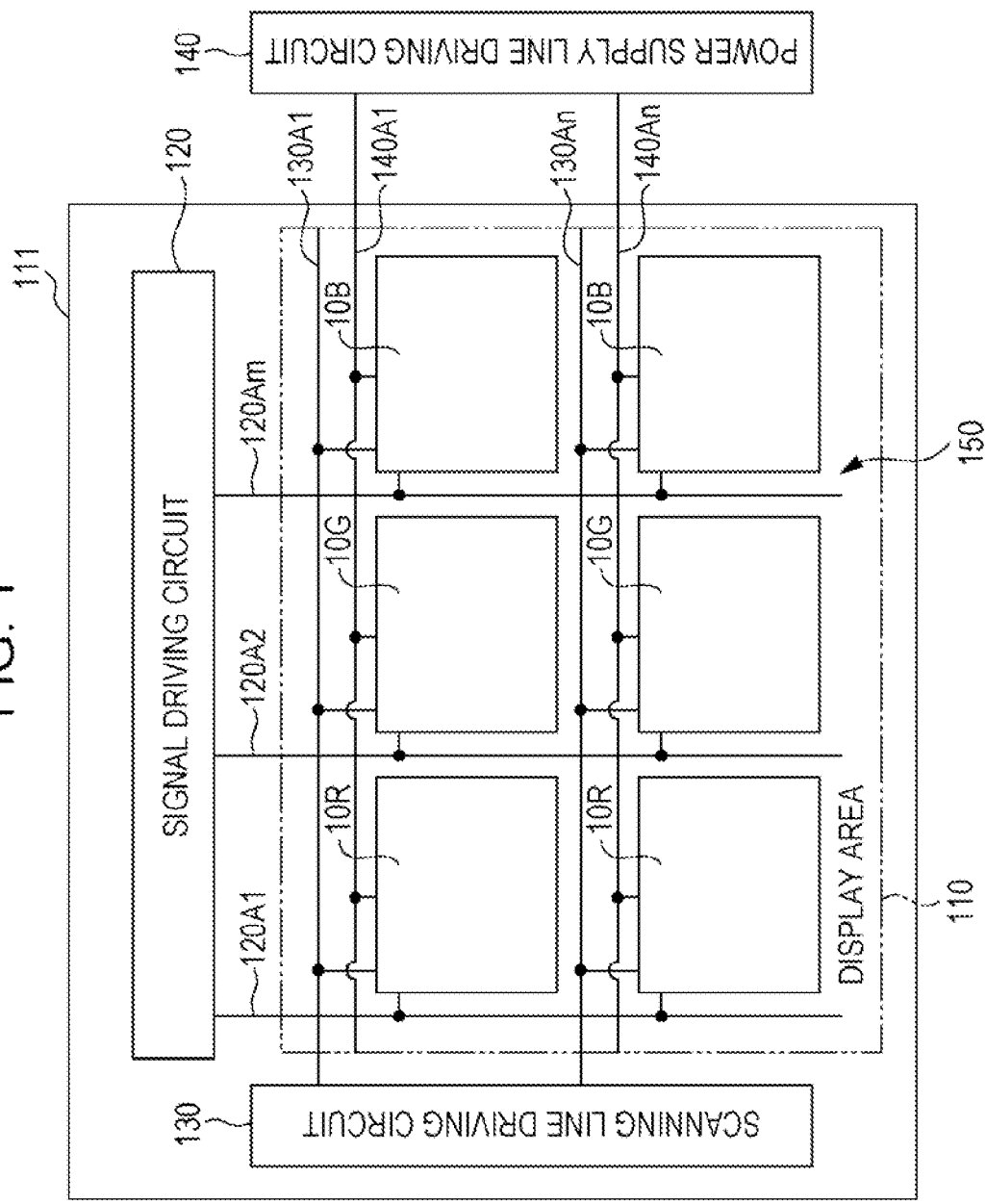
FIG. 1 is a diagram illustrating a configuration of a display device according to an example embodiment of the present disclosure.

FIG. 1 shows a configuration of a display device using light emitting elements according to an example embodiment of the present disclosure. The display device may be used as a very thin organic light emitting color display device and the like. This display device includes a display region 110 on a substrate 111. Around the display region 110 on the substrate 111, for example, a signal driving circuit 120, a scanning line driving circuit 130, and a power supply line driving circuit 140 are formed.

In the display region 110, organic light emitting elements 1R, 1G and 1B (not shown in FIG. 1) including light emitting portions 10 (10R, 10G, 10B), and pixel driving circuits 150 for driving the portions are formed. In the pixel driving circuits 150, a plurality of signal lines 120A (120A1, 120A2, ..., 120Am, ...) is disposed in the column direction (Y direction), and a plurality of scanning lines 130A (130A1, ..., 130An, ...) and a plurality of power supply lines 140A (140A1, ..., 140An, ...) are disposed in the row direction (X direction). One of the light emitting portions 10R, 10G and 10B is provided at each of the intersections of the signal lines 120A and the scanning lines 130A. The respective signal lines 120A are connected to the signal driving circuit 120, the respective scanning lines 130A are connected to the scanning line driving circuit 130, and the respective power supply lines 140A are connected to the power supply line driving circuit 140.

The signal driving circuit 120 supplies signal voltages of image signals corresponding to luminance information supplied from a signal supply source (not shown), to the respective selected light emitting portions 10R, 10G and 10B via the signal lines 120A.

The scanning line driving circuit 130 includes shift registers and the like which sequentially shift (transmit) a start pulse in synchronization with input clock pulses. The scanning line driving circuit 130 scans the respective scanning lines 130A with row units when the image signals are written in the respective light emitting portions 10R, 10G and 10B, and sequentially supplies scanning signals to the scanning lines 130A.

The power supply line driving circuit 140 includes shift registers and the like which sequentially shift (transmit) a start pulse in synchronization with input clock pulses. The power supply line driving circuit 140 appropriately supplies either of a first voltage and a second voltage which are different from each other to the power supply lines 140A in synchronization with the scanning with row unit by the scanning line driving circuit 130. Thereby, a driving transistor Tr1 described later is selectively switched between a conductive or non-conductive state.

Figure 2:
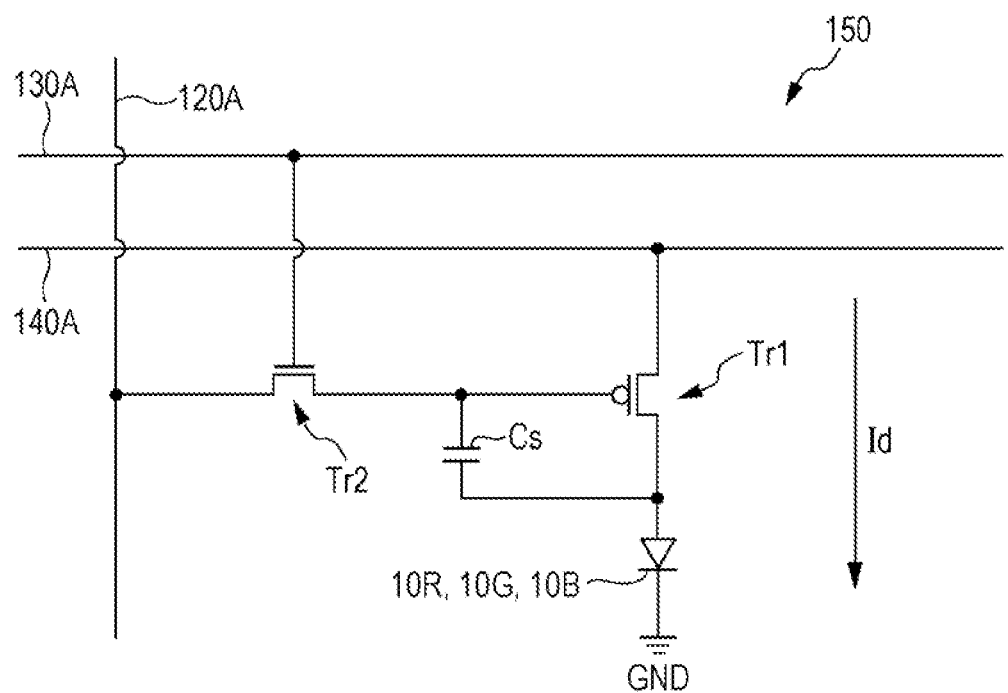
FIG. 2 is a diagram illustrating an example of a pixel driving circuit shown in FIG. 1.

The pixel driving circuits 150 are provided on a layer (a pixel driving circuit forming layer 112 described later) between the substrate 111 and the light emitting portions 10 (10R, 10G and 10B). FIG. 2 shows a configuration example of the pixel driving circuit 150. As shown in FIG. 2, the pixel driving circuit 150 is an active type driving circuit which includes the driving transistor Tr1, a write transistor Tr2, a capacitor (storage capacitor) Cs therebetween, and the light emitting portion 10. Each of the light emitting portions 10R, 10G and 10B is connected in series to the driving transistor Tr1 between the power supply line 140A and a common power supply line GND. The driving transistor Tr1 and the write transistor Tr2 are constituted by a typical thin film transistor (TFT), and a configuration thereof is not particularly limited, and, for example, may be a reverse stagger structure (a so called bottom gate type) or may be a stagger structure (a top gate type).

The write transistor Tr2 has, for example, a drain electrode connected to the signal line 120A and is supplied with an image signal from the signal driving circuit 120. Also, the write transistor Tr2 has a gate electrode connected to the scanning line 130A and is supplied with the scanning signal from the scanning line driving circuit 130. Further, a source electrode of the write transistor Tr2 is connected to a gate electrode of the driving transistor Tr1.

The driving transistor Tr1 has, for example, a drain electrode connected to the power supply line 140A and is set to either the first voltage or the second voltage from the power supply line driving circuit 140. A source electrode of the driving transistor Tr1 is connected to the light emitting portion 10.

The storage capacitor Cs is formed between the gate electrode of the driving transistor Tr1 (the source electrode of the write transistor Tr2) and the source electrode of the driving transistor Tr1.

Figure 3:
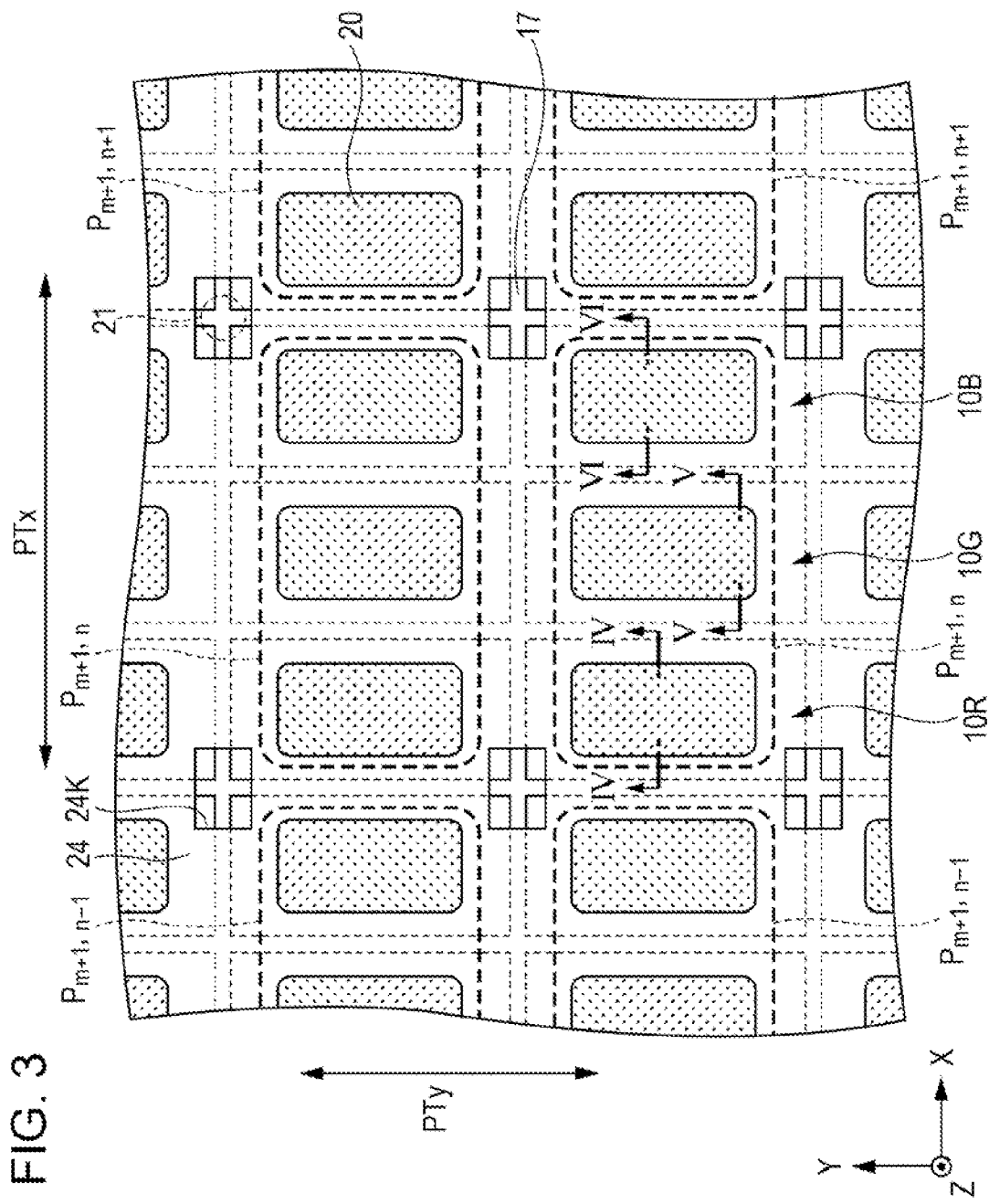
FIG. 3 is a plan view illustrating a configuration of the display region shown in FIG. 1.

FIG. 3 shows a configuration example of the display region 110 extended in the XY plane. Here, a planar configuration of the display region 110 from which a second electrode layer 16, a protective layer 18, and a sealing substrate 19 (which are all described later) are removed is shown in a plan view. In the display region 110, a plurality of light emitting portions 10 is sequentially arranged in a matrix as a whole. More specifically, a metal layer 17 which is an auxiliary wire layer is disposed in a reticular pattern, and, in each region divided by the metal layer 17, the light emitting portions 10 (10R, 10G and 10B) including emission regions 20 of which layouts are defined by an aperture defining insulation layer 24 are disposed one by one. Each of the emission regions 20 in the respective light emitting portions 10 has, for example, a substantially rectangular shape having a long side in the Y direction. The light emitting portion 10R of the organic light emitting element 1R emits red light, the light emitting portion 10G of the organic light emitting element 1G emits green light, and the light emitting portion 10B of the organic light emitting element 1B emits blue light. Here, the organic light emitting elements 1 having the light emitting portions 10 emitting the same colored light are arranged in one line in the Y direction, and these are repeatedly disposed in the X direction in a constant order (for example, in an order of the organic light emitting element 1R, the organic light emitting element 1G, and the organic light emitting element 1B). Three organic light emitting elements 1R, 1G and 1B which are arranged in the X direction and are different in emission colors constitute one pixel P. The period PTx of the pixels P ( ..., $P_{m,n-1}$, $P_{m,n}$, $P_{m,n+1}$, ... ) arranged in the X direction is longer than the period Pty of the pixels P ( ..., $P_{m-1,n}$, $P_{m,n}$, $P_{m+1,n}$, ... ) arranged in the Y direction. As shown in FIG. 3, apertures 24K are provided at the aperture defining insulation layer 24 in some of the intersections of the metal layer 17. In the region included in each of the apertures 24K, a connection portion 21 (a part surrounded by the broken line) for connecting the metal layer 17 to the second electrode layer 16 of the light emitting portion 10 is provided. Also, the number of the organic light emitting elements 1 (light emitting portions 10) arranged in the X and Y direction are set arbitrarily, and thus is not limited to the number shown in FIG. 3. Also, one pixel may include four or more organic light emitting elements, or organic light emitting elements emitting white light may be provided.

A detailed configuration of the display region 110 will be described with reference to FIGS. 4 to 9.

Figure 4:
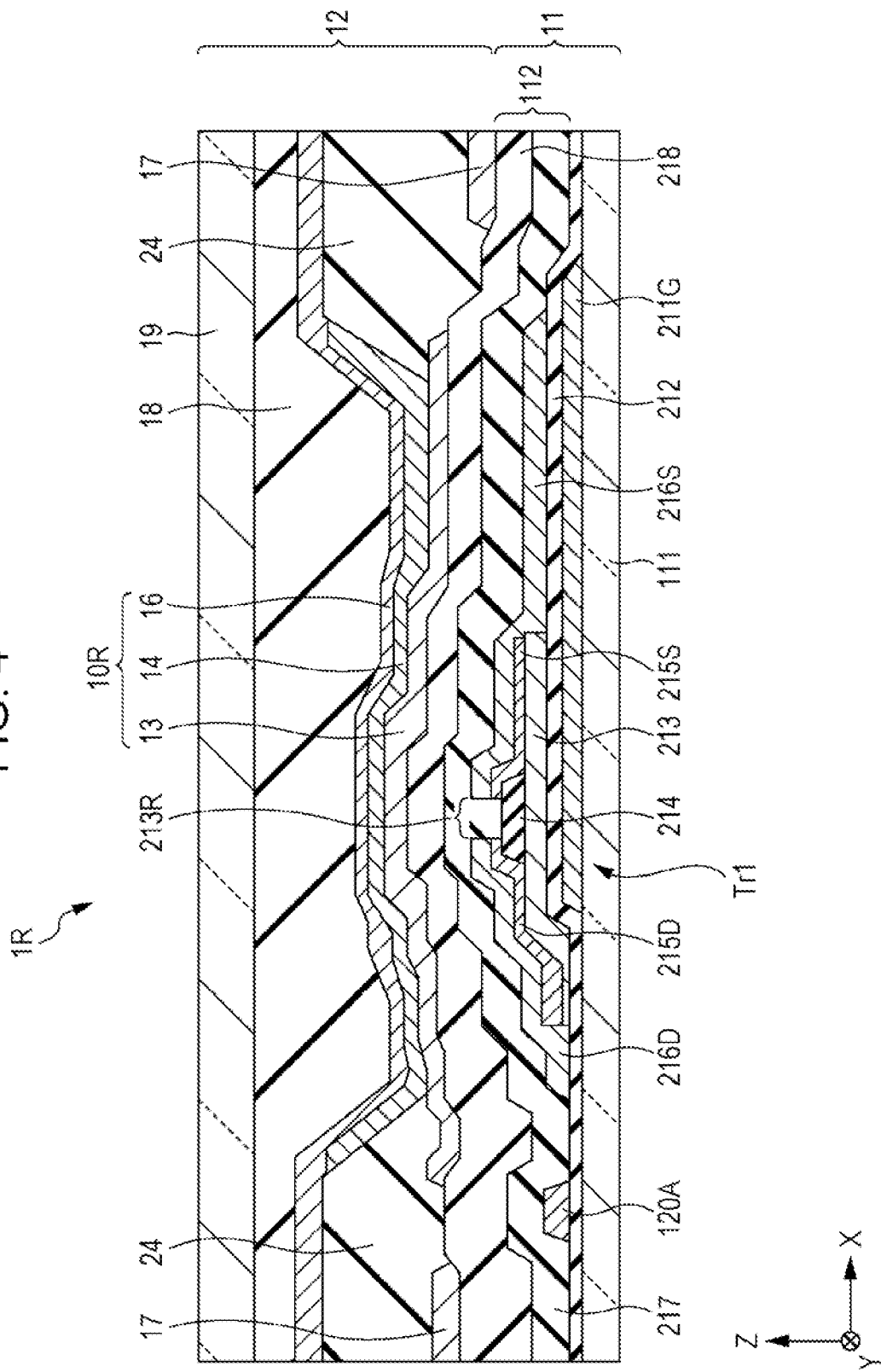
FIG. 4 is a cross-sectional view illustrating a first light emitting portion in the display region shown in FIG. 1.
Figure 5:
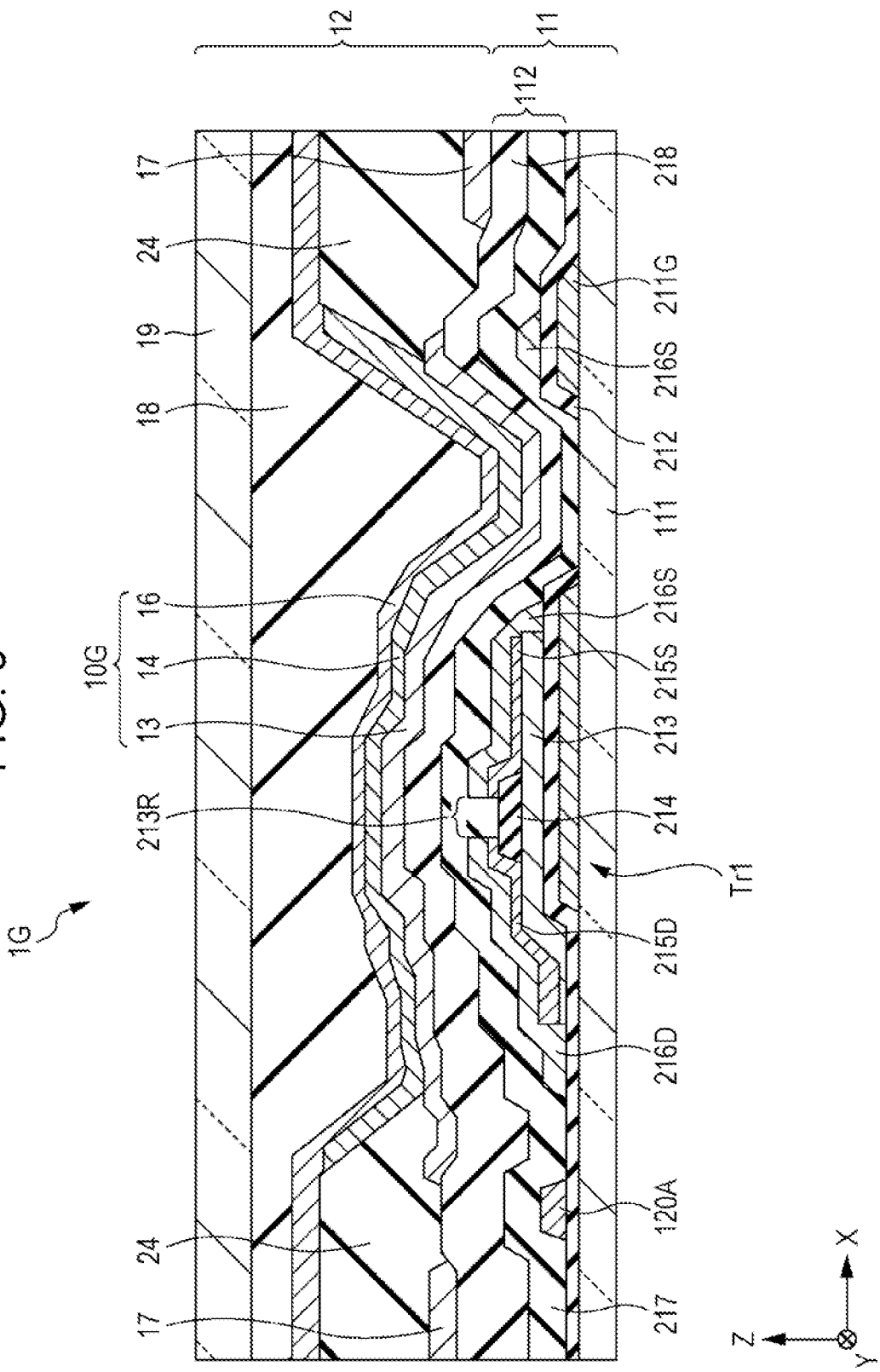
FIG. 5 is a cross-sectional view illustrating a second light emitting portion in the display region shown in FIG. 1.
Figure 6:
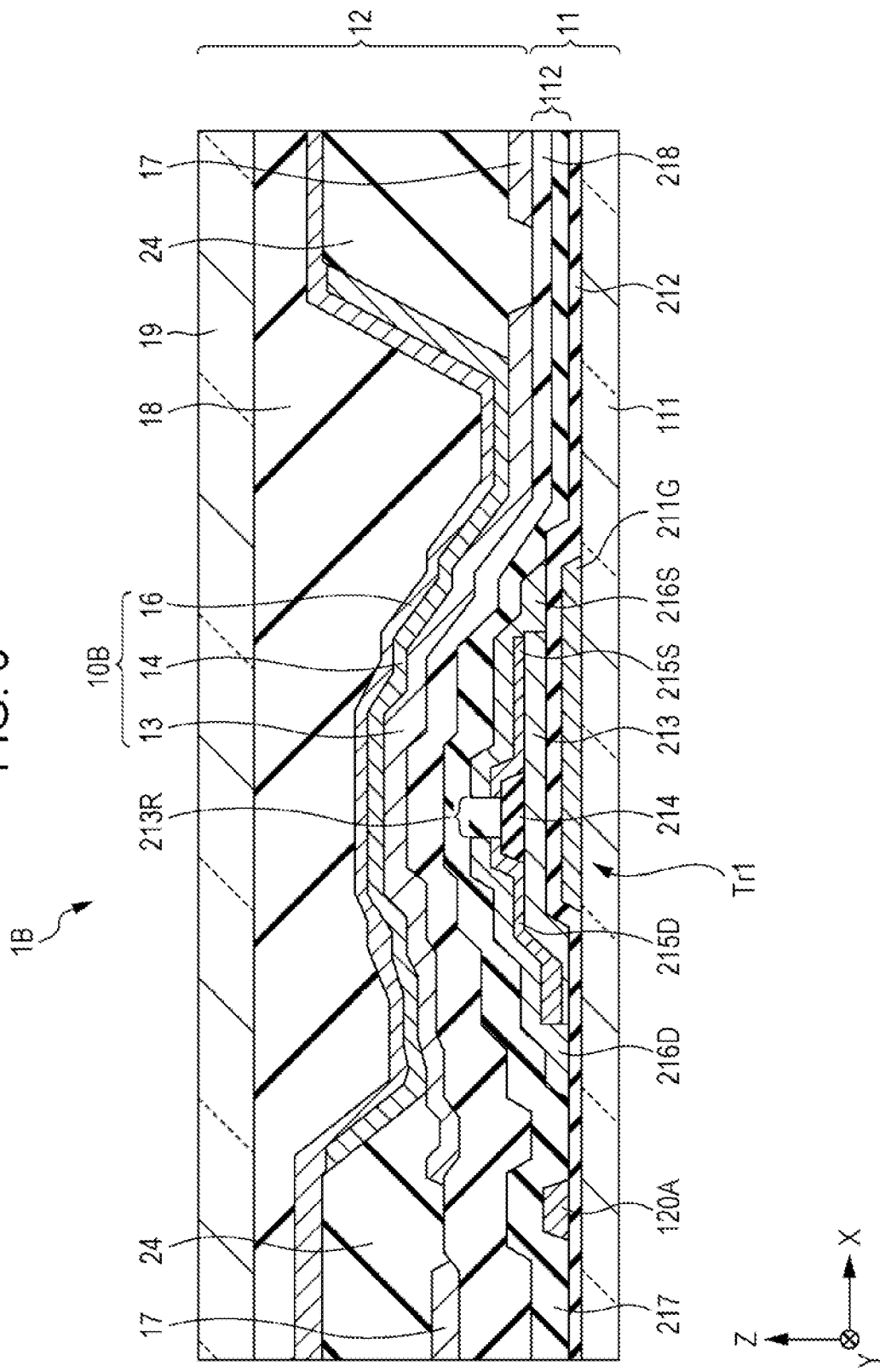
FIG. 6 is a cross-sectional view illustrating a third light emitting portion in the display region shown in FIG. 1.

FIGS. 4 to 6 respectively show cross-sectional configurations of the organic light emitting elements 1R, 1G and 1B of the pixel $1_{m,n}$ in the display region 110. In other words, FIGS. 4, 5 and 6 respectively show schematic configurations of XZ cross-sections taken along the lines IV-IV, V-V, and VI-VI shown in FIG. 3. As shown in each of FIGS. 4 to 6, in the display region 110, a light emitting portion forming layer 12 including the light emitting portion 10 is formed on a base 11 in which a pixel driving circuit forming layer 112 is provided on the substrate 111. The protective layer 18 and the sealing substrate 19 are sequentially provided on the light emitting portion 10. The light emitting portion 10 includes a first electrode layer 13 which is an anode electrode, an organic layer 14 including an emission layer 14C (described later), and a second electrode layer 16 which is a cathode electrode, which are sequentially laminated from the substrate 111 side. The organic layer 14 and the first electrode layer 13 are divided from each other by the aperture defining insulation layer 24 for each light emitting portion 10. The second electrode layer 16 is provided in all the light emitting portions 10. The metal layer 17 is covered by the aperture defining insulation layer 24 except for the regions corresponding to the apertures 24K.

The aperture defining insulation layer 24 is provided to fill a gap between the first electrodes 13 and the organic layers 14 in the adjacent light emitting portions 10. The aperture defining insulation layer 24 is made of, for example, an organic material such as polyimide or the like, secures insulation between the first electrode layer 13 and the second electrode layer 16, and the metal layer 17, and accurately demarcates the emission region 20 of the light emitting portion 10.

The protective layer 18 covering the light emitting portion 10 is made of an insulation layer such as silicon nitride (SiNx). The sealing substrate 19 formed thereon seals the light emitting portion 10 along with the protective layer 18, an adhesive layer (not shown) and the like, and is made of a transparent material such as glass which enables light generated from the emission layer 14C to be transmitted therethrough.

Hereinafter, a detailed configuration of the base 11 and the organic light emitting element 1 will be described. In addition, for the organic light emitting elements 1R, 1G and 1B, except that the sterical shape (concavo-convex shape) of the first electrode layer 13, the organic layer 14, and the second electrode layer 16, and materials forming the organic layer 14 are partially different from each other, the remaining configurations are the same, and thus the description thereof will be made together.

FIG. 7A is a schematic diagram illustrating a planar configuration of the pixel driving circuit 150 of the organic light emitting element 1R provided in the pixel driving circuit forming layer 112. Likewise, FIGS. 7B and 7C are schematic diagrams illustrating planar configurations of the pixel driving circuits 150 of the organic light emitting elements 1G and 1B. FIG. 4 shows a cross-section taken along the line IV-IV in FIG. 7A. Also, FIGS. 5 and 6 show cross-sections taken along the lines V-V and VI-VI in FIGS. 7B and 7C.

The base 11 is formed by providing the pixel driving circuit forming layer 112 including the pixel driving circuit 150 on the substrate 111 made of glass, silicon (Si) wafer, resin, or the like. On the surface of the substrate 111, as first metal layers, metal layers 211G which are the gate electrodes of the driving transistors Tr1, metal layers 221G which are the gate electrodes of the write transistors Tr2, and a part of the signal lines 120A (FIGS. 7A to 7C) are provided, respectively. The metal layers 211G, 221G and the signal lines 120A are covered by the gate insulation layers 212 made of silicon nitride, silicon oxide, or the like.

For each of the driving transistors Tr1, a channel layer 213 formed of a semiconductor thin film such as amorphous silicon or the like is provided in a part of the region corresponding to the metal layer 211G on the gate insulation layer 212. An insulating channel protective layer 214 is provided on the channel layer 213 so as to take up a channel region 213R which is a central region, and the drain electrode 215D and the source electrode 215S formed of an n type semiconductor thin film such as n type amorphous silicon are provided at both regions thereof. The drain electrode 215D and the source electrode 215S are divided from each other by the channel protective layer 214, and the end surfaces thereof are spaced apart from each other with the channel region 213R interposed therebetween. As second metal layers, a metal layer 216D which is a drain wire and a metal layer 216S which is a source wire are provided to cover the drain electrode 215D and the source electrode 215S, respectively. The metal layer 216D and the metal layer 216S have a structure where, for example, a titanium (Ti) layer, an aluminum (Al) layer, and a titanium layer are sequentially formed. The write transistor Tr2 has the same configuration as the driving transistor Tr1. In FIGS. 7A to 7C, metal layers 221G as the first metal layers, and metal layers 226D (drain wires) and metal layers 226S (source wiring) as the second metal layers are shown as the constituent elements of the write transistor Tr2.

As the second metal layers, in addition to the above-described metal layers 216D, 226D, 216S and 226S, the scanning lines 130A and the power supply lines 140A are provided. Here, although the driving transistor Tr1 and the write transistor Tr2 having a reverse stagger structure (a so-called bottom gate type) are described, a stagger structure (a so-called top gate type) may be employed. In addition, the signal lines 120A are formed as the second metal layers in regions other than the intersections of the scanning lines 130A and the power supply lines 140A.

The pixel driving circuits 150 are entirely covered by protective layers (passivation layers) 217 made of silicon nitride or the like, and, also insulating planarization layers 218 are provided thereon. The planarization layers 218 improve the planarity of the entire pixel driving circuit forming layer 112. In addition, fine connection holes 124 are provided in partial regions of the planarization layers 218 and the protective layers 217 (see FIGS. 7A to 7C). The planarization layers 218 particularly have the thickness larger than the protective layers 217, and thus are preferably made of a material having good pattern accuracy, for example, such as an inorganic material including polyimide and the like. The connection holes 124 are filled with the first electrode layers 13 and electrically connected to the metal layers 216S forming the source wires of the driving transistors Tr1.

The first electrode layers 13 formed on the planarization layers 218 also function as reflection layers, and are preferably made of a material having as high reflectivity as possible from the viewpoint of increasing the luminous efficiency. For this reason, the first electrode layers 13 are made of a material with high reflectivity such as aluminum (Al) or aluminum neodymium alloy (AlNd). Aluminum has low resistance to a developer used in a developing process when the apertures 24K of the aperture defining insulation layer 24 are formed and thus easily corroded. In contrast, AlNd has high resistance to a developer and is hardly corroded. Therefore, the first electrode layers 13 are preferably formed of a single layered structure made of AlNd or a double layered structure of an aluminum layer and AlNd (the Al layer (lower layer) and AlNd layer (upper layer)). Particularly, the double layered structure of the Al layer (lower layer) and the AlNd layer (upper layer) is preferable due to having low resistance as compared with the single layered AlNd layer. The entire thickness of the first electrode layer 13 ranges, for example, from 100 nm to 1000 nm. Also, if the first electrode layer 13 is formed of a double layered structured, the upper layer thereof (contacting with the organic layer 14) may be made of the above-described material having high reflectivity and the lower layer thereof (contacting with the planarization layer 218) may be made of a material having low reflectivity such as molybdenum (Mo) or compounds (alloys) thereof. In this way, the layer having high optical absorptance is provided on the surface which contacts with the pixel driving circuit forming layer 112 provided with the driving transistor Tr1 and the write transistor Tr2, and thereby it is possible to absorb unnecessary light such as external light or light leaked from the light emitting portion 10. Further, the first electrode layer 13 is formed to cover the surface of the planarization layer 218 and fills the connection hole 124, as described above.

None of the first electrode layer 13, the organic layer 14, and the second electrode layer 16 forming the light emitting portions 10R, 10G and 10B have horizontal surfaces but sterically undulating surface shapes including concave and convex. This is because as shown in the cross-sectional views in FIGS. 4 to 6, the surface of the pixel driving circuit forming layer 112 which underlies the light emitting portion forming layer 12 is not horizontal. That is to say, the sterical concavo-convex shape is particularly caused by the metal layers forming the driving transistor Tr1 and the write transistor Tr2, or the wire layers such as the signal lines 120A, the scanning lines 130A, and the power supply lines 140A, which are selectively provided on the substrate 111. The difference in height is generated in the surface of the pixel driving circuit forming layer 112 depending on the positions of the disposed metal layers or wired layers, and, as a result, the first electrode layer 13, the organic layer 14, and the second electrode layer 16 also have the difference in height in the XY plane depending on their positions.

In this example embodiment, positions of disposed metal layers and wired layers corresponding to the respective organic light emitting elements 1R, 1G and 1B in each pixel P or planar shapes thereof are different from each other. Specifically, the planar shapes thereof are different by changing positions or sizes of grooves or apertures in the metal layers 211G and 216S, in the organic light emitting elements 1R, 1G and 1B. Thereby, the organic light emitting elements 1R, 1G and 1B forming one pixel P are different from each other in undulation (sterical concavo-convex shape) of the layer surfaces of the light emitting portions 10R, 10G and 10B.

In this example embodiment, the light emitting portions 10 of a certain pixel (for example, the pixel $P_{m,n}$) preferably have layer surfaces different from the light emitting portions 10 of other pixels adjacent thereto (for example, $P_{m+1,n}$, $P_{m-1,n}$, $P_{m,n+1}$, and $P_{m,n-1}$). In this case, the light emitting portions 10 of the pixels P which are adjacent to each other at least in the X direction, and further the light emitting portions 10 of the pixels P which are adjacent to each other in the X and Y directions more preferably have undulating layer surfaces different from each other. In addition, in the display region 110, a plurality of light emitting portions 10 having undulation of the same layer surface shape is preferably arranged at an irregular interval in at least one direction of the X direction and the Y direction. Particularly, most preferably, in the display region 110 all of the light emitting portions 10 of the pixels P have undulating layer surfaces different from each other.

Figure 8:
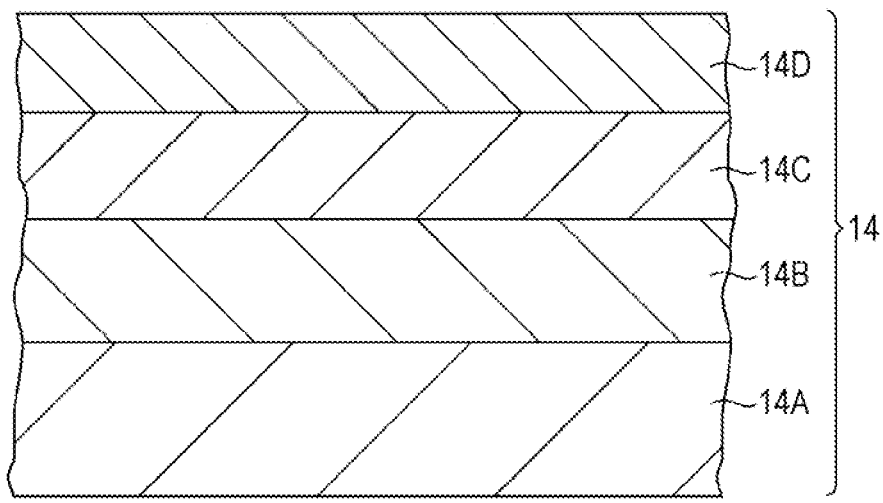
FIG. 8 is an enlarged cross-sectional view illustrating the organic layer shown in FIGS. 4 to 6.

The organic layer 14 is entirely formed in the emission region 20 demarcated by the aperture defining insulation layer 24 with no gaps. The organic layer 14, for example, as shown in FIG. 8, has a configuration where a hole injection layer 14A, a hole transfer layer 14B, the emission layer 14C, and an electron transfer layer 14D are sequentially laminated from the first electrode layer 13 side. The layers other than the emission layer 14C may be optionally formed. FIG. 8 shows the cross-section of the organic layer 14 through partial enlargement.

The hole injection layer 14A is a buffer layer for increasing hole injection efficiency and preventing leakage. The hole transfer layer 14B increases efficiency of transferring holes to the emission layer 14C. In the emission layer 14C, electrons and holes are recombined by application of an electric field and thus light is generated. The electron transfer layer 14D increases efficiency of transferring electrons to the emission layer 14C. An electron injection layer (not shown) made of LiF, $Li_2O$, or the like may be formed between the electron transfer layer 14D and the second electrode layer 16.

In addition, the organic layers 14 have different configurations depending on the emission colors of the light emitting portions 10R, 10G and 10B. The hole injection layer 14A of the light emitting portion 10R has the thickness of, for example, 5 nm or more to 300 nm or less and is made of 4,4',4''-tris(3-methylphenyl phenylamino), triphenylamino (m-MTDATA) or 4,4',4''-tris(2-naphthylphenylamino) (2-TNATA). The hole transfer layer 14B of the light emitting portion 10R has the thickness of, for example, 5 nm or more to 300 nm or less, and is made of bis[(N-naphtyl)-N-phenyl]benzidine (α-NPD). The emission layer 14C of the light emitting portion 10R has the thickness of, for example, 10 nm or more to 100 nm or less, and is made of a mixture of (tris(8-hydoxyquinoline)-aluminum ($Alq_3$) and 2,6-bis[4-[N-(4-methoxylphenyl)-N-phenyl]aminostyryl]naphthalene-1,5-dicarbonitrile (BSN-BCN) of 40% by volume. The electron transfer layer 14D of the light emitting portion 10R has the thickness of, for example, 5 nm or more to 300 nm or less, and is made of $Alq_3$.

The hole injection layer 14A of the light emitting portion 10G has the thickness of, for example, 5 nm or more to 300 nm or less and is made of m-MTDATA or 2-TNATA. The hole transfer layer 14B of the light emitting portion 10G has the thickness of, for example, 5 nm or more to 300 nm or less, and is made of α-NPD. The emission layer 14C of the light emitting portion 10G has the thickness of, for example, 10 nm or more to 100 nm or less, and is made of a mixture of $Alq_3$ and Coumarin6 of 3% by volume. The electron transfer layer 14D of the light emitting portion 10G has the thickness of, for example, 5 nm or more to 300 nm or less, and is made of $Alq_3$.

The hole injection layer 14A of the light emitting portion 10B has the thickness of, for example, 5 nm or more to 300 nm or less and is made of m-MTDATA or 2-TNATA. The hole transfer layer 14B of the light emitting portion 10B has the thickness of, for example, 5 nm or more to 300 nm or less, and is made of α-NPD. The emission layer 14C of the light emitting portion 10B has the thickness of, for example, 10 nm or more to 100 nm or less, and is made of spiro6φ). The electron transfer layer 14D of the light emitting portion 10B has the thickness of, for example, 5 nm or more to 300 nm or less, and is made of $Alq_3$.

The second electrode layer 16 has the thickness of, for example, 5 nm or more to 50 nm or less, and is made of a simple substance such as aluminum (Al), magnesium (Mg), calcium (Ca), sodium (Na) an alloy thereof or the like. Among them, an alloy of magnesium and silver (MgAg alloy), or an alloy of aluminum (Al) and lithium (Li) (AlLi alloy) is preferable. The second electrode layer 16 is commonly provided in all the light emitting portions 10R, 10G and 10B and is disposed opposite to the first electrode layer 13 of each of the light emitting portions 10R, 10G and 10B. Further, the second electrode layer 16 is formed to cover the aperture defining insulation layer 24 as well as the organic layer 14.

Figure 9:
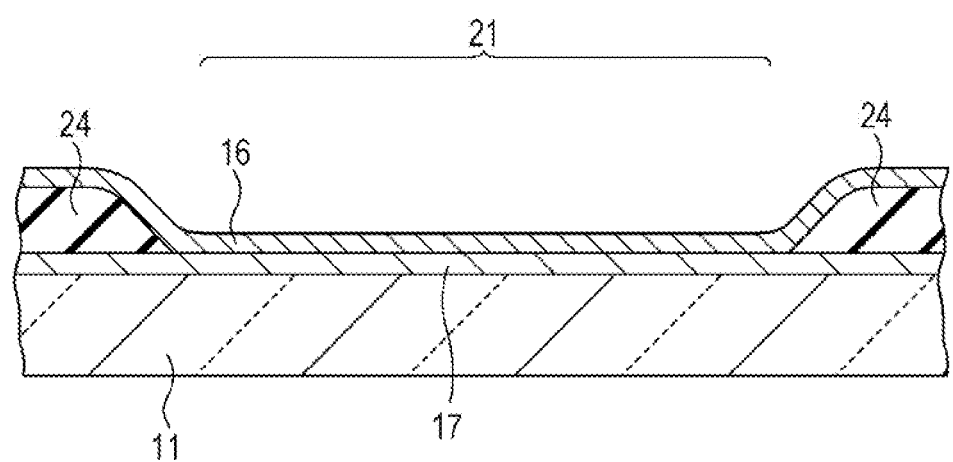
FIG. 9 is an enlarged cross-sectional view illustrating a cross-section of the connection portion shown in FIG. 3.
Figure 13:
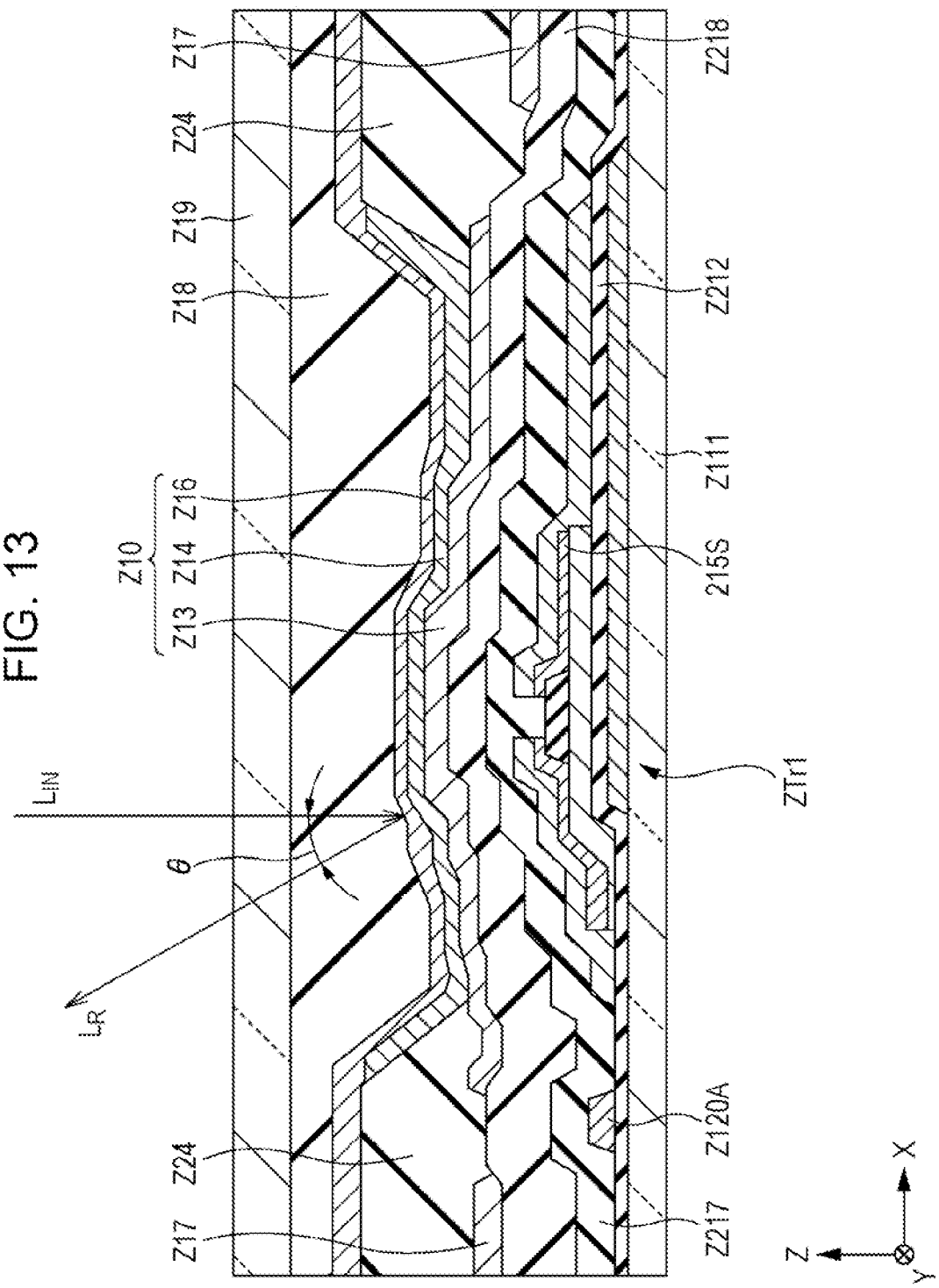
FIG. 13 is a cross-sectional view illustrating a configuration of a display device in the related art.

FIG. 9 shows the cross-section of the vicinity of the connection portion 21 shown in FIG. 3 through enlargement. The metal layer 17 is formed on the surface of the planarization layer 218 in the same manner as the first electrode layer 13 and functions as an auxiliary wire which supplements voltage drop at the second electrode layer 16. As described above, the metal layer 17 is covered by the second electrode layer 16 in the connection portion 21 inside the region of the aperture 24K, and is electrically connected to the second electrode layer 16 (see FIG. 10).

If the metal layer 17 does not exist, due to the voltage drop according to the distance between a power supply (not shown) and the respective light emitting portions 10R, 10G and 10B, potentials at the second electrode layer 16 connected to the common power supply line GND (see FIG. 2) are not constant in the respective light emitting portions 10R, 10G and 10B but have notable differences. The difference in the potentials at the second electrode layer 16 result in uneven luminance in the display region 110, and thus it is not preferable. The metal layer 17 suppresses the voltage drop from the power supply to the second electrode layer 16 to the minimum and functions to suppress the uneven luminance, even when the display device has a large size.

The display device can be manufactured as follows. Hereinafter, a manufacturing method of the display device in this example embodiment will be described with reference to FIGS. 4 to 7.

First, the pixel driving circuit 150 including the driving transistor Tr1 and the write transistor Tr2 is formed on the substrate 111 made of the above-described material. Specifically, first, a metal layer is formed on the substrate 111 by, for example, sputtering. Thereafter, the metal layers 211G and 221G and a part of the signal lines 120A are formed on the substrate 111 by patterning the metal layer by, for example, a photolithography method, a dry etching, or a wet etching. Next, the entire surface is covered by the gate insulation layer 212. Further, on the gate insulation layer 212, the channel layer, the channel protective layer, the drain electrode, the source electrode, and the metal layers 216D and 226D, and the metal layers 216S and the 226S are sequentially formed to have predetermined shapes, respectively. Here, a part of the signal lines 120A, and the scanning lines 130A and the power supply lines 140A are respectively formed as the second metal layers when the metal layers 216D and 226D and the metal layers 216S and 226S are formed. At this time, connection portions connecting the metal layer 221G to the scanning lines 130A, connection portions connecting the metal layer 226D to the signal lines 120A, and connection portions connecting the metal layer 226S to the metal layer 211G are formed in advance. Thereafter, the entire surface is covered by the protective layer 217 to complete the pixel driving circuit 150. At this time, the apertures are formed at predetermined positions on the metal layer 216S in the protective layer 217 by a dry etching or the like.

After the pixel driving circuits 150 are formed, a photosensitive resin using, for example, polyimide as a main component is coated on the entire surface by a spin coating method or the like. Next, a photolithography process is performed for the photosensitive resin, thereby forming the planarization layer 218 having the connection holes 124. Specifically, for example, through selective exposure and development using a mask having apertures at predetermined positions, the connection holes 124 which are connected to the apertures provided in the protective layer 217 are formed. Thereafter, the planarization layer 218 may be optionally fired. Thereby, the pixel driving circuit forming layer 112 is obtained.

Also, the first electrode layer 13 and the metal layer 17 made of the above-described materials are formed. Specifically, for example, the metal layer made of the above-described material is formed on the entire surface by, for example sputtering, a resist pattern (not shown) having a predetermined shape is formed on the laminated layer using a certain mask. Further, the metal layer is selectively etched using the resist pattern as a mask. At this time, the first electrode layer 13 is formed to cover the surface of the planarization layer 218 and fill the connection holes 124. In addition, the metal layer 17 is formed to surround the periphery of the first electrode layer 13 and not to overlap with the signal lines 120A on the surface of the planarization layer 218. The metal layer 17 is preferably formed along with the first electrode layer 13 using the same material as the first electrode layer 13.

Then, the aperture defining insulation layer 24 is formed to fill a gap between the first electrode layers 13 which are adjacent to each other and to cover the metal layer 17. At this time, the apertures 24K are formed at predetermined positions.

Next, in order to completely cover the exposed parts of the first electrode layer 13, the hole injection layer 14A, the hole transfer layer 14B, and the emission layer 14C, and the electron transfer layer 14D, which are made of the above-described predetermined materials and have the above-described thicknesses, are sequentially laminated by, for example, a deposition method, thereby forming the organic layer 14. Further, the second electrode layer 16 covers the organic layer 14 so as to be opposite to the first electrode layer 13 with the organic layer 14 interposed therebetween, and is formed to entirely cover the metal layer 17 in the connection portion 21, thereby forming the organic light emitting element 1.

The protective layer 18 is formed to cover the entire surface. Finally, the adhesive layer is formed on the protective layer 18, and the sealing substrate 19 is attached to the protective layer 18 via the adhesive layer. In this way, the display device is completed.

In the display device manufactured in this way, the scanning signal is supplied to each pixel from the scanning line driving circuit 130 via the gate electrode (the metal layer 221G) of the write transistor Tr2, and the image signal from the signal driving circuit 120 is stored in the storage capacitor Cs via the write transistor Tr2. The power supply line driving circuit 140 supplies the first voltage higher than the second voltage to each power supply line 140A in synchronization with the scanning with row units by the scanning line driving circuit 130. Thereby, the conductive state of the driving transistor Tr1 is selected to cause a driving current Id to be injected into each of the light emitting portions 10R, 10G and 10B, and thus holes and electrons are recombined to emit light. This light is multiply reflected between the first electrode layer 13 and the second electrode layer 16, is transmitted through the second electrode layer 16, the protective layer 18, and the sealing substrate 19, and is emitted outwards.

As described above, in this example embodiment, in an arbitrary pixel P, the positions of the arranged metal layers and wired layers, which form the pixel driving circuits 150 of the organic light emitting elements 1R, 1G and 1B, or the planar shapes thereof are different from each other. Thereby, the undulations (sterical concavo-convex shapes) on the layer surfaces of the light emitting portions 10R, 10G and 10B in the pixel P can be different from each other. For this reason, even when external light is incident, angles of the external light which is reflected from the layer surfaces of the light emitting portions 10R, 10G and 10B (particularly, the layer surfaces of the organic layers 14) are different from each other, and thus it is possible to suppress the interference of the reflected external light and decrease the intensity thereof. As a result, by means of the display device, it is possible to reduce generation of unnecessary light which hinders the recognition of original display images, and to secure better image display performance, even when the thickness of the planarization layer 218 is not increased and the entire configuration becomes thin.

In this example embodiment, in the case where the light emitting portions 10 of an arbitrary pixel P have undulating layer surfaces different from the light emitting portions 10 of other pixels adjacent thereto, it is possible to further reduce the interference and the intensity of the reflected external light. Also, if the interference and the intensity of the reflected external light are to be reduced, it is effective that the light emitting portions 10 including the organic layers 14 having the undulation of the same layer surface shape are irregularly arranged in at least one of the X direction the Y direction. Particularly, it is ideal and most preferable that the light emitting portions 10 of all the pixels P in the display region 110 have sterical shapes different from each other. However, if the light emitting portions 10 of the pixels P adjacent to each other in the X direction have undulating layer surfaces different from each other, it is possible to secure good image display performance to the extent of causing no inconvenience when practically used.

In addition, one display region 110 includes a plurality of divided areas, and the light emitting portions 10 having undulation of the same layer surfaces may be irregularly arranged in each divided area. In this case, the irregular arrangement patterns of the light emitting portions 10 in the plural divided areas may correspond with each other. In this case, for example, when the metal layers 211G and 216S are patterned, the same hard mask having a predetermined pattern shape is repeatedly used, and thus ease of manufacturing is improved.

In the above description, although the present disclosure has been described using the example embodiment, the present disclosure is not limited to the example embodiment but may have various modifications. For example, in the above-described example embodiment, although the case where all of the first electrode layer 13, the organic layer 14, and the second electrode layer 16 in the light emitting portions 10 adjacent to each other have undulating layer surfaces different from each other has been described, the present disclosure is not limited thereto. The organic layers 14 in which more reflected external light occurs may have undulations different from each other.

In addition, when the undulation of the layer surface shape of the organic layer is changed, for example, as shown in FIGS. 10A to 10C, only positions of apertures of constituent elements (specifically, the metal layers 211G and 216S) of the pixel driving circuit forming layer 112 which is a base of the light emitting portion 10 may be changed. Alternatively, for example, as shown in FIGS. 11A to 11C, only the sizes and the shapes of the apertures may be changed. Further, for example, as shown in FIGS. 12A and 12B, an isolated interposition layer DP may be provided independently from the constituent elements of the pixel driving circuit 150 such as the metal layers 211G and 216S. In addition, for example, as shown in FIG. 12C, shapes (for example, a partial shape of the power supply line 140A) of constituent elements other than the driving elements may be changed. In addition, the combination of the shapes, the sizes and the positions of the respective constituent elements of the pixel driving circuit forming layer 112 shown in FIGS. 7, and 10A to 12C are only an example, and the present disclosure is not limited thereto. As long as the undulation of the surface shape of the pixel driving circuit forming layer 112 is changed, the undulation of the layer surface shape of the light emitting portion 10 may be changed.

The present disclosure is not limited to the materials for the respective layers, the laminating order, or the layer forming methods described in the above-described example embodiment. For example, in the example embodiment, although the case where the first electrode layer 13 is an anode and the second electrode layer 16 is a cathode has been described, the first electrode layer 13 may be a cathode and the second electrode layer 16 may be an anode. Further, in the example embodiment, although the detailed configurations of the light emitting portions 10R, 10G and 10B have been all described, it is not necessary for all the layers to be provided but another layer may be provided. For example, a hole injection thin film layer made of chromium oxide (III) ($Cr_2O_3$), ITO (Indium Tin Oxide: an oxide film of mixture of indium (In) and tin (Sn)), or the like may be formed between the first electrode layer 13 and the organic layer 14.

In addition, in the example embodiment, although the case where the second electrode layer 16 is formed of the transflective reflection layer has been described, the second electrode layer 16 may have a structure where the transflective reflection layer and a transparent electrode are sequentially laminated from the first electrode layer 13 side. The transparent electrode decreases electric resistance of the transflective reflection layer, and is made of a conductive material which allows light generated from the emission layer to be sufficiently transmitted therethrough. As a material forming the transparent electrode, for example, ITO or a compound including indium, zinc (Zn), and oxygen is preferable. This is because good conductivity is obtained even when a film is formed at room temperature. The thickness of the transparent electrode may be, for example, from 30 nm to 1000 nm. Also, in this case, a resonator structure may be formed in which the transflective layer is one end, the other end is formed at a position opposite to the transflective electrode with the transparent electrode interposed therebetween, and the transparent electrode is a resonant portion. Further, after the resonator structure is formed, the light emitting portions 10R, 10G and 10B are covered by the protective layer 18, and if the protective layer 18 is made of a material having almost the same refractive index as the material forming the transparent electrode, the protective layer 18 can be formed as a part of the resonant portion, which is preferable.

In addition, in the example embodiments, although the case of the active matrix type display device has been described, the present disclosure is applicable to passive matrix type display devices. Further, the configurations of the pixel driving circuits for the active matrix driving are not limited to ones described in the example embodiments, but capacitive elements or transistors may be added if necessary. In this case, necessary driving circuits may be added in addition to the above-described signal driving circuit 120 and scanning line driving circuit 130.

It should be understood that various changes and modifications to the presently preferred example embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A display device comprising:
a circuit layer provided on a substrate;
a planarization layer provided on the circuit layer; and
a display layer provided on the planarization layer,
the circuit layer includes at least a first driving transistor, a second driving transistor and the third driving transistor,
the display layer includes at least a first light emitting element, a second light emitting element and a third light emitting element, the first light emitting element, the second light emitting element and the third light emitting element disposed in a first direction in a plan view,
the first light emitting element includes a first anode electrode and a first light emitting layer disposed on the first anode electrode,
the second light emitting element includes a second anode electrode and a second light emitting layer disposed on the second anode electrode,
the third light emitting element includes a third anode electrode and a third light emitting layer disposed on the third anode electrode,
a first connection hole is disposed in the planarization layer,
a second connection hole is disposed in the planarization layer,
a third connection hole is disposed in the planarization layer,
the first anode electrode is electrically connected to the first driving transistor via the first connection hole,
the second anode electrode is electrically connected to the second driving transistor via the second connection hole,
the third anode electrode is electrically connected to the third driving transistor via the third connection hole,
a shape of the first anode electrode, a shape of the second anode electrode and a shape of the third electrode are different,
the first connection hole, the second connection hole and the third connection hole are disposed in the first direction,
each of the first anode electrode, the second anode electrode and the third anode electrode repeat in a constant order in the first direction in at least a portion of a display region,
the first anode electrode has a first width in the first direction and a first length in a second direction orthogonal to the first direction,
the second anode electrode has a second width in the first direction and a second length in the second direction,
the third anode electrode a third width in the first direction and a third length in the second direction,
each of the first, second and third lengths are greater than each of the first, second and third widths,
the first anode electrode, the second anode electrode and the third anode electrode each have a first end opposite a second end in the second direction,
the first connection hole is disposed in the first end of the first anode electrode,
the second connection hole is disposed in the first end of the second anode electrode, and
the third connection hole is disposed in the first end of the third anode electrode.

2. The display device according to claim 1, wherein the first light emitting element is configured to emit a first light, the second light emitting element is configured to emit a second light and the third light emitting element is configured to emit a third light, and the first light, the second light and the third light are different.

3. The display device according to claim 2, wherein the first light is red, the second light is blue, and the third light is green.

4. The display device according to claim 1, wherein at least one of the first light emitting element, the second light emitting element or the third light emitting element is configured to emit white light.

5. The display device according to claim 1, further comprising a fourth light emitting element which includes a fourth anode electrode and a fourth light emitting layer disposed on the fourth anode electrode, wherein the fourth light emitting is configured to emit a fourth light.

6. The display device according to claim 5, wherein the fourth light is white.

7. The display device according to claim 1, wherein
the first connection hole is proximate to a first edge of the first end of the first anode electrode,
the second connection hole is proximate to a second edge of the first end of the second anode electrode, and
the third connection hole is proximate to a third edge of the first end of the third anode electrode.

8. The display device according to claim 7, wherein each of the first connection hole, the second connection hole and the third connection hole are each closer to one corner in the first end than another corner in the first end, respectively.

9. A display device comprising:
a circuit layer provided on a substrate;
a planarization layer provided on the circuit layer; and
a display layer provided on the planarization layer,
the circuit layer includes at least a first driving transistor, a second driving transistor and the third driving transistor,
the display layer includes at least a first light emitting element, a second light emitting element and a third light emitting element, the first light emitting element, the second light emitting element and the third light emitting element disposed in a first direction in a plan view,
the first light emitting element includes a first anode electrode and a first light emitting layer disposed on the first anode electrode,
the second light emitting element includes a second anode electrode and a second light emitting layer disposed on the second anode electrode,
the third light emitting element includes a third anode electrode and a third light emitting layer disposed on the third anode electrode,
a first connection hole is disposed in the planarization layer,
a second connection hole is disposed in the planarization layer,
a third connection hole is disposed in the planarization layer,
the first anode electrode is electrically connected to the first driving transistor via the first connection hole, the second anode electrode is electrically connected to the second driving transistor via the second connection hole, the third anode electrode is electrically connected to the third driving transistor via the third connection hole, a shape of the first anode electrode, a shape of the second anode electrode and a shape of the third electrode are different, and the first connection hole, the second connection hole and the third connection hole are disposed in the first direction, wherein the first anode electrode has a first width in the first direction and a first length in a second direction different from the first direction, the second anode electrode has a second width in the first direction and a second length in the second direction, the third anode electrode a third width in the first direction and a third length in the second direction, the first length is longer than the first width, the second length is longer than the second width, the third length is longer than the third width, the first anode electrode, the second anode electrode and the third anode electrode each have a first end opposite a second end in the second direction, the first connection hole is disposed in the first end of the first anode electrode, the second connection hole is disposed in the first end of the second anode electrode, the third connection hole is disposed in the first end of the third anode electrode, the first connection hole is proximate to a first edge of the first end of the first anode electrode, the second connection hole is proximate to a second edge of the first end of the second anode electrode, and the third connection hole is proximate to a third edge of the first end of the third anode electrode.

10. The display device according to claim 9, wherein each of the first light emitting element, the second light emitting element and the third light emitting element are configured to emit at red light, blue light, green light or white light.

11. The display device according to claim 10, wherein each of the first connection hole, the second connection hole and the third connection hole are each closer to one corner in the first end than another corner in the first end, respectively.

12. The display device according to claim 10, wherein each of the first anode electrode, the second anode electrode and the third anode electrode repeat in a constant order in at least a portion of a display region.

13. The display device according to claim 12, wherein each of the first connection hole, the second connection hole and the third connection hole are each closer to one corner in the first end than another corner in the first end, respectively.

14. The display device according to claim 9, wherein at least two of the first width, the second width, and the third width are substantially the same.

15. The display device according to claim 14, wherein at least two of the first length, the second length, and the third length are substantially the same.

16. The display device according to claim 9, wherein at least two of the first length, the second length, and the third length are substantially the same.

* * * * *